United States Patent
Koike et al.

(10) Patent No.: US 9,602,053 B2
(45) Date of Patent: Mar. 21, 2017

(54) AUDIO FM TRANSMITTER

(71) Applicant: Circuit Design, Inc., Nagano (JP)

(72) Inventors: Yukinaga Koike, Nagano (JP); Yuuichi Miyashita, Nagano (JP)

(73) Assignee: Circuit Design, Inc., Azumino, Nagano (JP)

(*) Notice: Subject to any disclaimer, the term of this patent is extended or adjusted under 35 U.S.C. 154(b) by 0 days.

(21) Appl. No.: 14/674,904

(22) Filed: Mar. 31, 2015

(65) Prior Publication Data

US 2015/0281841 A1  Oct. 1, 2015

(30) Foreign Application Priority Data

Mar. 31, 2014 (JP) ................................ 2014-074100

(51) Int. Cl.
| | |
|---|---|
| *H04H 40/45* | (2008.01) |
| *H03C 3/09* | (2006.01) |
| *H04H 20/44* | (2008.01) |
| *H04B 1/02* | (2006.01) |
| *H03L 7/18* | (2006.01) |
| *H04R 3/00* | (2006.01) |
| *H04B 1/00* | (2006.01) |

(52) U.S. Cl.
CPC ......... *H03C 3/0916* (2013.01); *H03C 3/0908* (2013.01); *H03C 3/0958* (2013.01); *H03C 3/0966* (2013.01); *H03L 7/18* (2013.01); *H04B 1/02* (2013.01); *H04H 20/44* (2013.01); *H04R 3/00* (2013.01); *H04B 1/00* (2013.01); *H04H 40/45* (2013.01)

(58) Field of Classification Search
CPC .......... H03L 7/18; H04H 40/45; H04H 20/44; H04H 20/48; H03C 3/0908; H03C 3/095; H03C 3/0916; H03C 3/0958; H04R 3/00; H04B 1/02; H04B 1/00
See application file for complete search history.

(56) References Cited

U.S. PATENT DOCUMENTS

| | | | | |
|---|---|---|---|---|
| 5,337,024 A * | 8/1994 | Collins | ................ | H03C 3/0925 332/127 |
| 6,917,317 B2 * | 7/2005 | Nagaso | ................. | H03L 7/1978 341/131 |
| 8,664,989 B1 * | 3/2014 | Singh | .................... | H03L 7/1976 327/147 |
| 2007/0279109 A1 * | 12/2007 | Kirschenmann | ........ | H03L 7/185 327/156 |
| 2008/0036545 A1 * | 2/2008 | Mellot | .................. | G06F 1/0321 331/16 |
| 2012/0313676 A1 * | 12/2012 | Nguyen | .................... | H03L 7/23 327/156 |

FOREIGN PATENT DOCUMENTS

| | | |
|---|---|---|
| JP | H11234128 A | 8/1999 |
| JP | 2008177818 A | 7/2008 |

* cited by examiner

*Primary Examiner* — Andrew L Sniezek
(74) *Attorney, Agent, or Firm* — Brian J. Colandreo; Michael T. Abramson; Holland & Knight LLP

(57) ABSTRACT

An audio FM transmitter is disclosed that may achieve high-precision frequency control as well as compact size and low cost by enabling FM modulation using a fractional-N type PLL circuit.

1 Claim, 3 Drawing Sheets

AUDIO FM TRANSMITTER

TECHNICAL FIELD

The present invention relates to an audio FM transmitter.

This application claims priority to JP-A-2014-074100, filed on Mar. 31, 2014, which is incorporated herein by reference in its entirety.

BACKGROUND ART

An audio FM transmitter for wirelessly transmitting an audio signal (e.g., an audio signal of an audible frequency between 10 Hz and 20 kHz) in an ultra high frequency band such as the UHF band (between 300 MHz and 3 GHz) should generate a high-frequency reference signal. A known circuit for generating such a high-frequency signal is a frequency multiplier circuit. The frequency multiplier circuit can generate a high-frequency signal by extracting a high-frequency component from a low-frequency oscillation signal generated by a crystal resonator. However, in order to generate a desired high-frequency signal, the frequency multiplier circuit needs to be multistaged, which disadvantageously increases the size and cost of the circuit, so it is difficult to apply the multistaging of the frequency multiplier circuit to the audio FM transmitter that is highly required to achieve compact size and low cost.

In order to solve such a problem, a phase locked loop (PLL) circuit is widely used. For example, as shown in FIG. 3, a PLL circuit 100 includes a crystal resonator 101, a crystal oscillator 102, a reference frequency divider 103, a phase comparator 104, a programmable frequency divider 105, a loop filter 106 and a voltage-controlled oscillator (VCO) 107. In the PLL circuit 100, the crystal oscillator 102 outputs a reference signal by the oscillation of the crystal resonator 101, and the reference frequency divider 103 frequency-divides the reference signal. The phase comparator 104 outputs a phase difference signal depending on the phase difference between the output from the reference frequency divider 103 and the output from the programmable frequency divider 105, and the loop filter 106 integrates and converts the phase difference signal into a DC voltage signal. The voltage-controlled oscillator 107 performs oscillation using the DC voltage signal as a control signal to vary the oscillation frequency. The programmable frequency divider 105 frequency-divides the oscillation output branched from the output of the voltage-controlled oscillator 107 at a frequency division ratio set therein and outputs the division result to the phase comparator 104 (e.g., see FIG. 1 in Patent Document 1).

Conventionally, when the above-described PLL circuit 100 is applied to an audio FM transmitter, an audio signal is FM-modulated by superimposing a modulating signal in accordance with the audio signal onto the voltage-controlled oscillator 107, as shown in FIG. 3. In other words, the voltage-controlled oscillator 107 performs oscillation at a center frequency (carrier frequency) in accordance with the DC voltage signal from the loop filter 106 and FM-modulates the oscillation output with the modulating signal to transmit the FM-modulated signal from an antenna.

PRIOR ART DOCUMENT

Patent Document

[Patent Document 1] JP-A-11-234128

SUMMARY OF THE INVENTION

Problems to be Solved by the Invention

It is an object of the present invention to solve the above-described problem of the prior art.

Means for Solving the Problems

In order to solve this problem, the audio FM transmitter in accordance with one aspect of the embodiment is an audio FM transmitter that analog FM-modulates an audio signal using a PLL modulation means and transmits the FM-modulated audio signal, including: the PLL modulation means; and a control means for outputting a frequency divider setting signal to the PLL modulation means, the PLL modulation means including: a first voltage-controlled oscillation means for performing outputting according to a reference signal caused by the oscillation of a resonator; a phase comparison means for converting into a voltage the phase difference between the signal output from the first voltage-controlled oscillation means and a phase comparison signal input from a fractional-N type frequency divider and outputting the voltage as a phase difference signal; a low-pass filtering means for removing a high-frequency component from the phase difference signal output from the phase comparison means; a second voltage-controlled oscillation means for controlling an oscillation frequency according to the phase difference signal output from the low-pass filtering means as a control voltage; and the fractional-N type frequency divider for frequency-dividing an branched output from the second voltage-controlled oscillation means, wherein the PLL modulation means is configured as a digital PLL modulation means that can control the oscillation frequency according to the frequency divider setting signal, and wherein the first voltage-controlled oscillation means outputs an FM-modulated signal by analog FM-modulating the oscillation frequency of the reference signal with a modulating signal in accordance with the audio signal.

MODE FOR CARRYING OUT THE INVENTION

An embodiment of an audio FM transmitter (hereinafter referred to as an FM transmitter) in accordance with the invention is described below in detail with reference to the drawings. First, a concept in accordance with one aspect of the embodiment is described, then, the embodiment is specifically described, and finally, a variation of the embodiment is described. However, the invention is not intended to be limited to the embodiment.

[I] Concept in Accordance with One Aspect of the Embodiment

First, a concept in accordance with one aspect of the embodiment is described. The FM transmitter in accordance with the embodiment is an audio FM transmitter for wirelessly transmitting an audio signal (e.g., an audio signal of an audible frequency between 10 Hz and 20 kHz) in an ultra high frequency band such as the UHF band (between 300

MHz and 3 GHz). Any specific type of sources may be used as an output source of the audio signal, for example, the sources including various instruments, such as a microphone, guitar and keyboard, and various audio devices, such as a studio system and audio mixer. For example, the FM transmitter may be mounted onto a microphone to configure a wireless microphone or may be mounted onto various instruments, such as a guitar or keyboard, to configure a wireless instrument. Note that the radio frequency to be used is not limited to the ultra high frequency band, but, for example, a very high frequency band such as the VHF band (between 30 MHz and 300 MHz) may be used. Furthermore, the specific frequency band to be used may be appropriately changed according to the radio-related laws and regulations or the like of a country in which the FM transmitter is used.

Specifically, the FM transmitter in accordance with the embodiment is configured to be an FM transmitter that achieves high-precision frequency control as well as compact size and low cost using a fractional-N type PLL modulator (PLL modulation circuit) to generate and FM-modulate a high-frequency reference signal. However, with the fractional-N type PLL modulator, it is difficult to superimpose the modulating signal onto the voltage-controlled oscillator of the PLL modulator as described above. So, the FM modulation is configured to be done by controlling the oscillation frequency of the voltage-controlled crystal oscillator of the PLL modulator.

[II] Specific Description of the Embodiment

Figure 1:
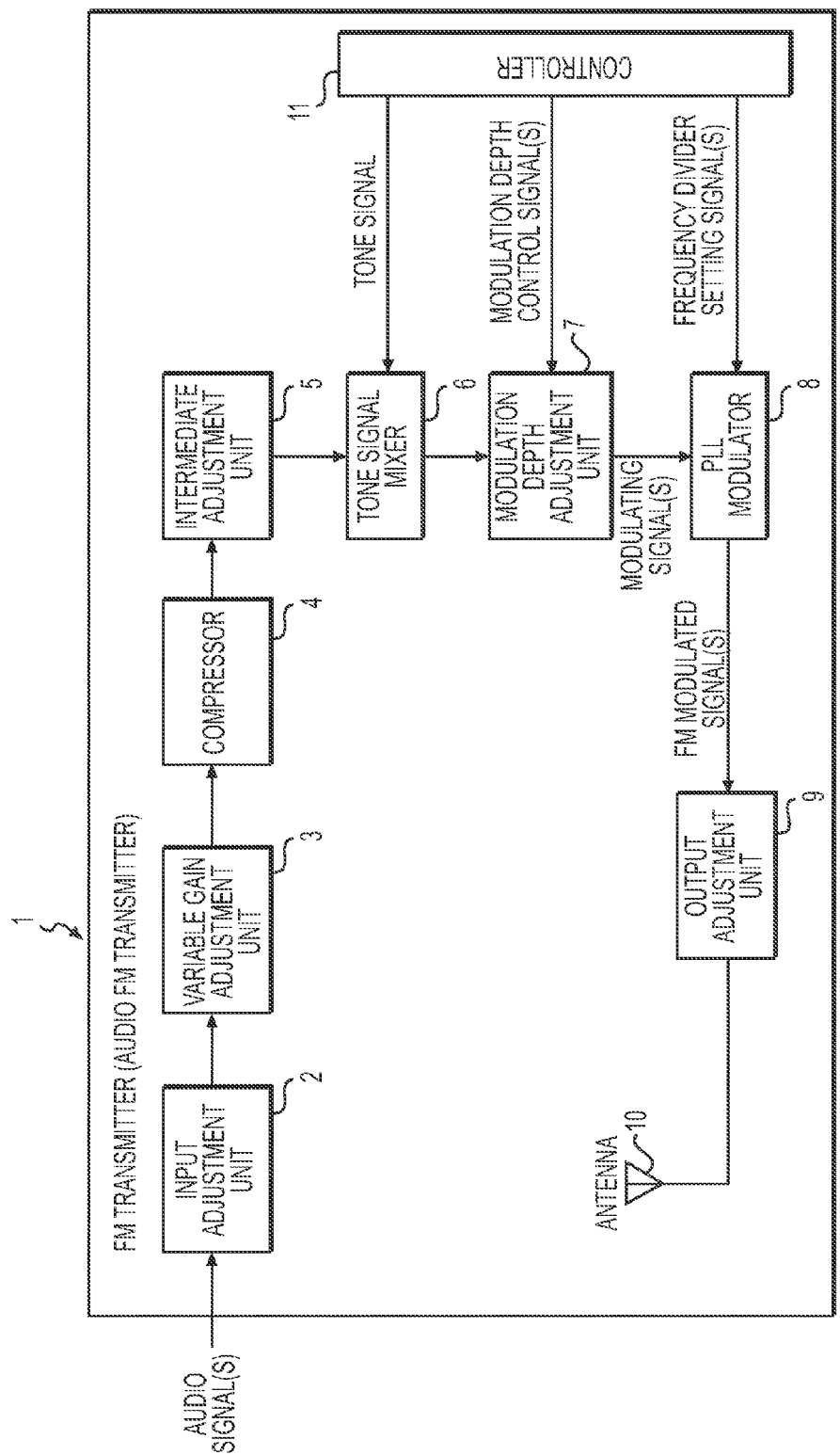
FIG. 1 is a block diagram of an audio FM transmitter in accordance with an embodiment of the invention.

Next, the FM transmitter in accordance with the embodiment is specifically described. FIG. 1 is a block diagram of the FM transmitter. As shown in FIG. 1, the FM transmitter 1 includes an input adjustment unit 2, a variable gain adjustment unit 3, a compressor 4, an intermediate adjustment unit 5, a tone signal mixer 6, a modulation depth adjustment unit 7, a PLL modulator 8, an output adjustment unit 9, an antenna 10 and a controller 11, all of which are connected as shown.

(Configuration—Input Adjustment Unit)

The input adjustment unit 2 is an input adjustment means for impedance-matching an input audio signal (e.g., an audio signal of an audible frequency between 10 Hz and 20 kHz) using an FET or the like, as well as preventing the voltage of the audio signal from exceeding an allowable voltage to protect the circuit.

(Configuration—Variable Gain Adjustment Unit)

The variable gain adjustment unit 3 is a variable gain adjustment means for level-adjusting the audio signal output from the input adjustment unit 2 using an operational amplifier or the like.

(Configuration—Compressor)

The compressor 4 is a compression means (compander) for, in order to improve the S/N ratio using compander noise reduction method, compressing the audio signal output from the variable gain adjustment unit 3 to one half in log ratio.

(Configuration—Intermediate Adjustment Unit)

The intermediate adjustment unit 5 is an adjustment means configured using an operational amplifier or the like for improving the S/N ratio of the audio signal output from the compressor 4 using pre-emphasis method, including: a high-frequency component enhancement means for enhancing in advance a noise component added in a transmission path; a current-voltage conversion means for performing current-voltage conversion; an amplitude limiting means for performing amplitude limiting for voltage amplitude regulation in order to avoid undesired amplitude fluctuation; and a high-frequency component removal means for removing a high-frequency component through a low-pass filter.

(Configuration—Tone Signal Mixer)

The tone signal mixer 6 is a tone signal mixing means for, in order to perform tone squelch, mixing a tone signal output from the controller 11 with the audio signal output from the intermediate adjustment unit 5 using a summing amplifier or the like.

(Configuration—Modulation Depth Adjustment Unit)

The modulation depth adjustment unit 7 is a modulation depth adjustment means for adjusting the modulation depth of the audio signal output from the tone signal mixer 6 using an electronic volume or the like according to a modulation depth control signal, such as a mute signal, output from the controller 11 to output a modulating signal.

(Configuration—PLL Modulator)

The PLL modulator 8 is a PLL modulation means for performing fractional PLL modulation with the modulating signal using a reference signal based on the frequency oscillation of the crystal resonator $8a_1$ described later to output an analog FM-modulated signal (hereinafter referred to as an FM-modulated signal). The PLL modulator 8 is described later in detail.

(Configuration—Output Adjustment Unit)

The output adjustment unit 9 is an output wave extraction means for extracting an output wave from the FM-modulated signal output from the PLL modulator 8, using a low-pass filter adapted to an output frequency or the like, and also is an electrostatic protection means for preventing the internal circuit of the FM transmitter 1 from being damaged by a high voltage due to static electricity hit to the antenna 10, using an electro-static discharge (ESD) protection diode or the like.

(Configuration—Antenna)

The antenna 10 wirelessly transmits the FM-modulated signal output from the output adjustment unit 9, by radio emission. For example, the antenna 10 is an omnidirectional or unidirectional, quarter- or half-wavelength antenna.

(Configuration—Controller)

The controller 11 is a control means for controlling various components of the FM transmitter 1, which provides a tone signal to the tone signal mixer 6, a mute control signal to the modulation depth adjustment unit 7 and a frequency divider setting signal to the PLL modulator 8. For example, the controller 11 is configured using a one-chip microcomputer.

(Configuration—Detail of PLL Modulator)

Figure 2:
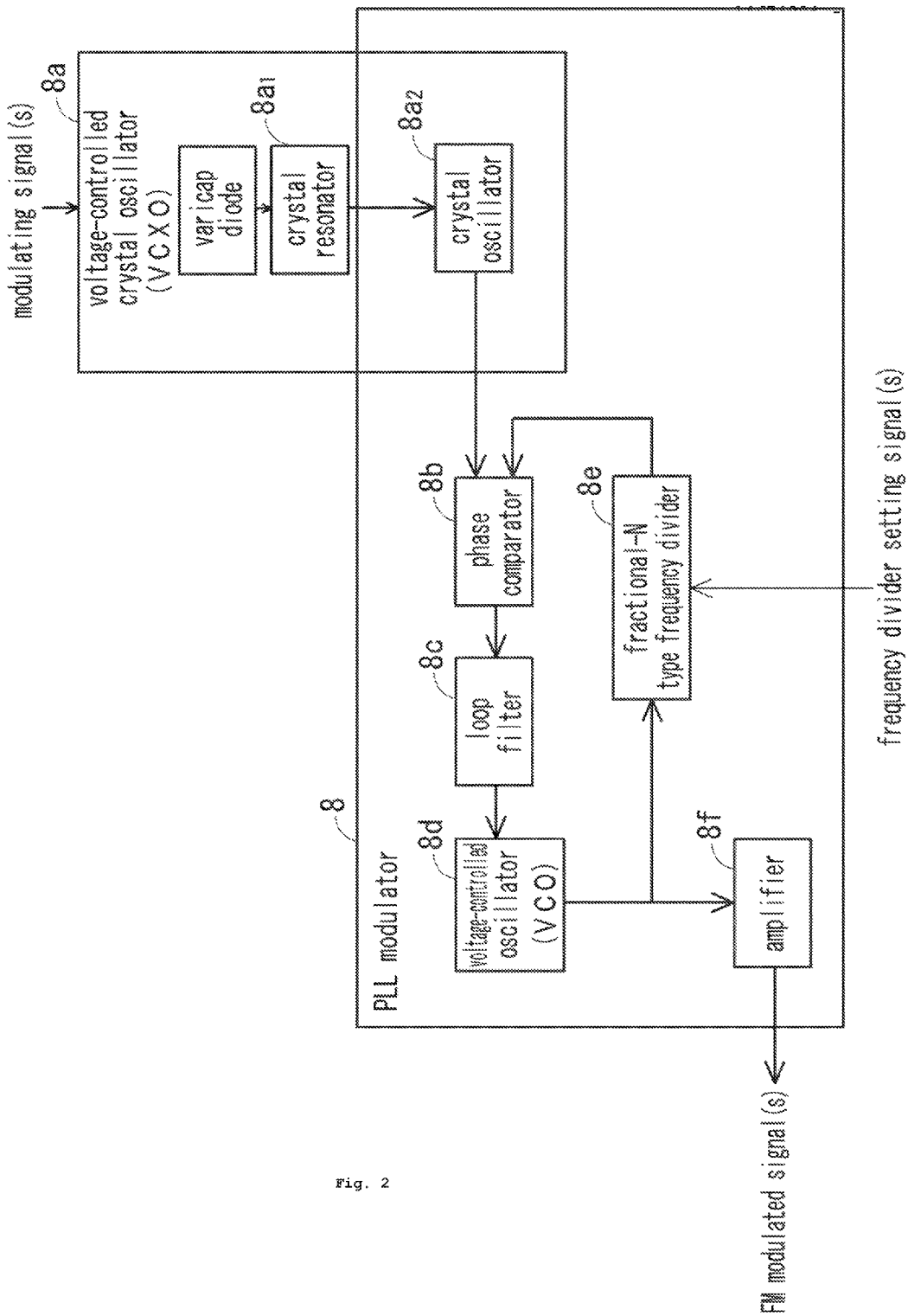
FIG. 2 is a block diagram of a PLL modulator in FIG. 1.
Figure 3:
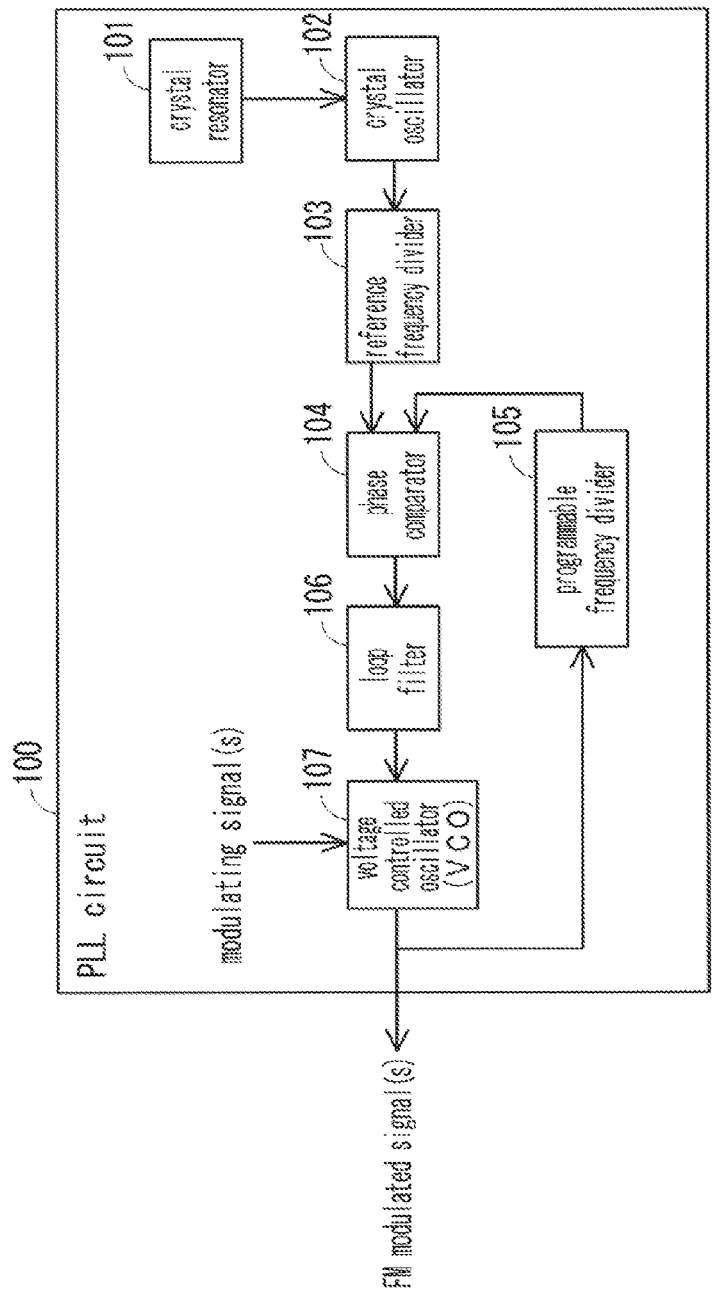
FIG. 3 is a block diagram of a conventional PLL circuit.

Next, the PLL modulator 8 in FIG. 1 is described in more detail. FIG. 2 is a block diagram of the PLL modulator 8. As shown in FIG. 2, the PLL modulator 8 is a fractional-N type PLL means, which includes a voltage-controlled crystal oscillator 8a, a phase comparator 8b, a loop filter 8c, a voltage-controlled oscillator 8d, a fractional-N type frequency divider 8e and an amplifier 8f, all of which are connected as shown. Specifically, the PLL modulator 8 is configured as a digital PLL modulation circuit that can control the oscillation frequency according to the frequency divider setting signal output from the controller 11. For example, the components of the PLL modulator 8 except the crystal resonator $8a_1$ described later of the voltage-controlled crystal oscillator 8a and the like can be configured as a one-chip IC. For example, for such a one-chip IC, a one-chip IC designed for digital data wireless communication may also be utilized.

(Configuration—Detail of PLL Modulator—Voltage-Controlled Crystal Oscillator)

The voltage-controlled crystal oscillator (VCXO) 8a is a first voltage-controlled oscillation means for voltage-controlling the oscillation frequency. The voltage-controlled crystal oscillator 8a includes: the crystal resonator (e.g., a crystal resonator with a fundamental frequency of 16 MHz) 8a.sub.1 that is caused to oscillate by the piezoelectric effect of a crystal; and a crystal oscillator 8a.sub.2 for outputting a reference signal generated by the oscillation of the crystal resonator 8a.sub.1. Specifically, the voltage-controlled crystal oscillator 8a is an FM modulation means for performing the analog FM modulation by controlling the oscillation frequency of the reference signal by causing the capacity of a varicap diode (as shown in FIG. 2) to vary according to the modulating signal output from the modulation depth adjustment unit 7 in FIG. 1 as a control voltage. Note that, for the resonator, a ceramic resonator or a surface acoustic wave (SAW) resonator may be used in place of the crystal resonator 8a.sub.1.

(Configuration—Detail of PLL Modulator—Phase Comparator)

The phase comparator 8b is a phase comparison means for converting into a voltage the phase difference between the FM-modulated signal output from the voltage-controlled crystal oscillator 8a and the phase comparison signal input from the fractional-N type frequency divider 8e and outputting the voltage as a phase difference signal.

(Configuration—Detail of PLL Modulator—Loop Filter)

The loop filter 8c is a low-pass filtering means for integrating the phase difference signal output from the phase comparator 8b using a low-pass filter to remove an unnecessary high-frequency component from the phase difference signal and output a signal including only a DC component. Note that the time constant of the loop filter 8c may be set to any appropriate value. For example, the time constant may be set to 10 times the target frequency or so. However, if the time constant is too high, the noise increases; if the time constant is too low, the trackability becomes worse. So, the time constant is preferably set in consideration of the balance between the noise and the trackability. Furthermore, the cut-off frequency of the loop filter 8c may be set to any appropriate value. However, preferably, the cut-off frequency is set to a frequency higher than the maximum value of the audible frequency (20 kHz), for example, to 100 kHz, which can shift the frequency of noise that occurs when the lockup is disturbed by vibration, feedback or the like into the non-audible frequency band (e.g., between 100 kHz and 1 MHz), suppressing noise occurring in the audible frequency band.

(Configuration—Detail of PLL Modulator—Voltage-Controlled Oscillator)

The voltage-controlled oscillator (VCO) 8d is a second voltage-controlled oscillation means for controlling the oscillation frequency by causing the capacity of a varicap diode (not shown) to vary according to the phase difference signal output from the loop-filter 8c as a control voltage. Note that a buffer may be provided in the subsequent stage of the voltage-controlled oscillator 8d.

(Configuration—Detail of PLL Modulator—Fractional-N Type Frequency Divider)

The fractional-N type frequency divider 8e is a frequency division means for frequency-dividing the frequency of the oscillation signal output from the voltage-controlled oscillator 8d into a phase comparison frequency, the fractional-N type frequency divider 8e being a fractional frequency division means for performing frequency division by alternately switching between two integer frequency dividers and using the average frequency division ratio of the switching time (=the frequency division ratio of the non-integer (fraction) of 1/N). Note that the frequency division ratio of the fractional-N type frequency divider 8e can be set to any appropriate value using the frequency divider setting signal from the controller 11. Furthermore, for example, the fractional-N type frequency divider 8e is not limited to a fixed frequency divider, but may be a frequency divider using a dual modulus prescaler method employing a microcomputer or a variable frequency modulator or the like method. Alternatively, a frequency divider may be provided between the voltage-controlled crystal oscillator 8a and the phase comparator 8b.

(Configuration—Detail of PLL Modulator—Amplifier)

The amplifier 8f is an amplification means for power-amplifying the oscillation signal output from the voltage-controlled oscillator 8d and outputting a transmission signal of, for example, 10 mW.

(Operation)

Next, the operation of the FM transmitter 1 configured as above is described. In the FM transmitter 1 in FIG. 1, when an audio signal output from various output sources, such as a microphone, is input to the input adjustment unit 2, the audio signal is impedance-matched in the input adjustment unit 2, then level-adjusted in the variable gain adjustment unit 3, then compressed to one half in log ratio in the compressor 4, then subjected to current-voltage conversion and the like in the intermediate adjustment unit 5, then mixed with a tone signal in the tone signal mixer 6, then subjected to modulation depth adjustment in the modulation depth adjustment unit 7, and then output to the PLL modulator 8 as a modulating signal.

Then, in the PLL modulator 8 in FIG. 2, the analog FM modulation is performed using the modulating signal output from the modulation depth adjustment unit 7 in the voltage-controlled crystal oscillator 8a. Then, the phase difference between the FM-modulated signal and the phase comparison signal input from the fractional-N type frequency divider 8e is output as a phase difference signal from the phase comparator 8b. Then, a signal including only the DC component of the phase difference signal is extracted in the loop filter 8c. Then, in the voltage-controlled oscillator 8d, the oscillation frequency is controlled using the phase difference signal output from the loop filter 8c as a control voltage to output an oscillation signal. The oscillation signal output from the voltage-controlled oscillator 8d as above is branched into two. One branched signal is fractional-frequency-divided in the fractional-N type frequency divider 8e and output to the phase comparator 8b. The other branched signal is amplified in the amplifier 8f and output to the output adjustment unit 9 in FIG. 1. Then, in the output adjustment unit 9, a high-frequency component is removed from the other branched oscillation signal, the resulting signal of which is emitted as a radio wave from the antenna 10.

According to this operation, since the analog FM modulation is performed using the modulating signal output from the modulation depth adjustment unit 7 in the voltage-controlled crystal oscillator 8a, in contrast to the prior art, the modulating signal need not be superimposed onto the voltage-controlled oscillator 8d. So, even when the phase comparison frequency of the fractional-N type PLL modulator 8 is as high as several megahertz, the FM modulation can be reliably performed. Furthermore, since the modulating signal need not be superimposed onto the voltage-controlled oscillator 8d, the time constant of the loop filter 8c can be small, allowing high-speed lockup immediately after power-on.

Particularly, in the embodiment, the analog FM modulation and the PLL modulation circuit are combined, so the FM transmitter 1 can provide the advantages of the both. Specifically, according to the wireless communication technology trend in these years, digital modulation communication has become more widely used in communication than analog modulation communication. However, the digital modulation communication needs processings including A/D conversion of analog signals, compression, expansion and D/A conversion, which inevitably causes communication delay or latency. It should be appreciated that in wireless audio communication, especially in a live stage show, immediate responsiveness is required, and any communication delay or latency is fatal and unacceptable. Accordingly, in wireless audio communication, analog modulation communication is preferably employed rather than digital modulation communication. Then, in such analog modulation communication, an analog PLL modulation circuit using a multiplier may be used rather than a digital PLL modulation circuit. However, in the analog PLL modulation circuit, if the time constant of the loop filter is increased in order to reduce phase noise, the capture range becomes narrower to deteriorate the trackability to an external signal, which more likely causes out of lock due to failing in pull-in. Then, once out of lock occurs, the reliability and convenience of the FM transmitter 1 may be significantly reduced, for example, the FM transmitter 1 may need to be shutdown and repowered. In contrast, the digital PLL modulation circuit can reliably perform pull-in and has no risk of causing out of lock in principle. Accordingly, the embodiment employs the analog FM modulation to achieve highly immediate responsiveness, and also configures the PLL modulator 8 as the digital PLL modulation circuit rather than the analog PLL modulation circuit to eliminate the risk of causing out of lock. As described above, the new and unprecedented FM communication method in which the analog FM modulation and the digital PLL modulation circuit are combined is employed to enable the FM transmitter 1 that can provide the advantages of the both to be configured.

Furthermore, particularly, in the embodiment, even if a one-chip IC for audio communication in which the analog FM modulation and the digital PLL modulation circuit is combined as described above does not exists, if a one-chip IC for wireless digital data communication including the digital PLL modulation circuit exists, this one-chip IC can be utilized to configure the FM transmitter 1. Specifically, in the one-chip IC for wireless digital data communication, with its digital transmission function unused, the analog FM modulation is performed in the voltage-controlled crystal oscillator 8a of the digital PLL modulation circuit (PLL modulator 8) to achieve the analog FM modulation using the digital PLL modulation circuit.

[III] Variation of the Embodiment

Although the embodiment in accordance with the invention has been described, the specific configuration and means of the invention can be modified and improved in any appropriate manner without departing from the scope of the technical spirit of the invention as defined by the appended claims. Such a variation is described below.

(On Problem to be Solved and Advantage of the Invention)

First, the problem to be solved and the advantage of the invention is not limited to what is described above, but may vary depending on the implementation environment and configuration detail of the invention, and only part of the above-described problem may be solved or only part of the above-described advantage may be achieved. For example, even if the FM transmitter of the invention cannot improve frequency control precision in comparison with the conventional FM transmitter, if the frequency control precision comparable with that of the conventional FM transmitter is achieved by the FM transmitter 1 of the invention that is different from the conventional FM transmitter, the problem for the invention is solved.

(On Distribution and Integration)

Furthermore, the electric components described above are functionally conceptual and is not necessarily required to be physically configured as illustrated. In other words, the specific form of the distribution and integration of the components is not limited to what is illustrated, but all or part thereof can be functionally or physically distributed or integrated in any appropriate unit for configuration depending on various loads or usage. For example, the voltage-controlled crystal oscillator 8a may be configured as part of the PLL modulator 8, including through the crystal resonator $8a_1$ or may be configured as an external component of the PLL modulator 8.

(On Shape, Value, Structure and Time Series)

For the components illustrated in the embodiment and drawings, the shape, value, or structure or time-series mutual relation of a plurality of the components can be modified and improved in any appropriate manner without departing from the scope of the technical spirit of the invention. For example, a well known circuit, such as various protection circuits, adjustment circuits, channel switching circuits, power supply circuits and infrared-ray communication circuits for setting a channel with a receiver, may be added.

[IV] Problem of the Embodiment

The PLL circuit that has been described as the background art is broadly classified by frequency division method into two types: an integer-N type (integer frequency division type) capable of generating an output frequency equal to the integral multiple of an input frequency; and a fractional-N type (fractional frequency division type) capable of generating an output frequency equal to the fractional multiple of an input frequency. Then, the fractional-N type PLL circuit advantageously has high resolution frequency setting capability and, therefore, high precision frequency control capability over the integer-N type PLL circuit, but disadvantageously has complicated circuit design, which makes downsizing of the circuit difficult and likely causes a characteristic spurious to occur. But, in recent years, with the progression of microfabrication technology, one-chip integration of the fractional-N type PLL circuit is also progressing, such that a compact circuit with a small spurious is provided, so it is becoming realistic that such a fractional-N type PLL circuit is applied to the audio FM transmitter.

However, since the phase comparison frequency of the fractional-N type PLL circuit is as high as several megahertz, an attempt to superimpose a modulating signal onto the voltage-controlled oscillator of the PLL circuit in a conventional way is quickly subjected to frequency correction, failing in the FM modulation.

In view of the above, it is an object of the embodiment to provide an audio FM transmitter that achieves high-precision frequency control as well as compact size and low cost by enabling the FM modulation using a fractional-N type PLL circuit.

[V] Audio FM Transmitter in Accordance with One Aspect of the Embodiment

The audio FM transmitter in accordance with one aspect of the embodiment is an audio FM transmitter that analog FM-modulates an audio signal using a PLL modulation means and transmits the FM-modulated audio signal, including: the PLL modulation means; and a control means for outputting a frequency divider setting signal to the PLL modulation means, the PLL modulation means including: a first voltage-controlled oscillation means for performing outputting according to a reference signal caused by the oscillation of a resonator; a phase comparison means for converting into a voltage the phase difference between the signal output from the first voltage-controlled oscillation means and a phase comparison signal input from a fractional-N type frequency divider and outputting the voltage as a phase difference signal; a low-pass filtering means for removing a high-frequency component from the phase difference signal output from the phase comparison means; a second voltage-controlled oscillation means for controlling an oscillation frequency according to the phase difference signal output from the low-pass filtering means as a control voltage; and the fractional-N type frequency divider for frequency-dividing an branched output from the second voltage-controlled oscillation means, wherein the PLL modulation means is configured as a digital PLL modulation means that can control the oscillation frequency according to the frequency divider setting signal, and wherein the first voltage-controlled oscillation means outputs an FM-modulated signal by analog FM-modulating the oscillation frequency of the reference signal with a modulating signal in accordance with the audio signal.

According to the audio FM transmitter, since the oscillation frequency of the reference signal is analog FM-modulated with the modulating signal in accordance with the audio signal in the first voltage-controlled oscillation means, the modulating signal need not be superimposed onto the second voltage-controlled oscillation means. So, even when the phase comparison frequency is as high as several megahertz, the FM modulation can be reliably performed. This enables the FM modulation using the fractional-N type PLL modulation means, allowing the audio FM transmitter that achieves high-precision frequency control as well as compact size and low cost to be provided. Specifically, with the integer-N type PLL circuit, since the phase comparison frequency is equal to the channel spacing, the phase comparison frequency cannot be set to be high. On the other hand, with the fractional-N type PLL modulation means, even if the phase comparison frequency is set to be high, the channel setting can be done at a fractional frequency division ratio (1/N). Furthermore, since the modulating signal need not be superimposed onto the second voltage-controlled oscillation means, the time constant of the low-pass filtering means can be small, allowing high-speed lockup immediately after power-on.

Furthermore, since the PLL modulation means is configured as the digital PLL modulation means, a risk of causing out of lock, such as in using the analog PLL modulation means, is eliminated, which can improve the reliability and convenience of the FM transmitter 1.

The audio FM transmitter in accordance with another aspect of the embodiment is the audio FM transmitter according to the one aspect of the embodiment, wherein, in the PLL modulation means, the first voltage-controlled oscillation means or at least part thereof, the phase comparison means, the low-pass filtering means, the second voltage-controlled oscillation means and the fractional-N type frequency divider are configured as a one-chip IC.

According to the audio FM transmitter, since the main part of the PLL modulation means is configured as a one-chip IC, the first voltage-controlled oscillation means of the one-chip IC analog FM-modulates the oscillation frequency of the reference signal with the modulating signal, which allows the audio FM transmitter to achieve more compact size and lower cost.

DESCRIPTION OF REFERENCE NUMERALS AND SIGNS

1 FM transmitter (audio FM transmitter)
2 input adjustment unit
3 variable gain adjustment unit
4 compressor
5 intermediate adjustment unit
6 tone signal mixer
7 modulation depth adjustment unit
8 PLL modulator
8a voltage-controlled crystal oscillator
$8a_1$ crystal resonator
$8a_2$ crystal oscillator
8b phase comparator
8c loop filter
8d voltage-controlled oscillator
8e fractional-N type frequency divider
8f amplifier
9 output adjustment unit
10 antenna
11 controller
100 PLL circuit
101 crystal resonator
102 crystal oscillator
103 reference frequency divider
104 phase comparator
105 programmable frequency divider
106 loop filter
107 voltage controlled oscillator

The invention claimed is:

1. An audio Frequency Modulation (FM) transmitter that analog FM-modulates an audio signal using a Phase Locked Loop (PLL) modulation means and transmits the FM-modulated audio signal, comprising:
the PLL modulation means; and
a control means for outputting a frequency divider setting signal to the PLL modulation means,
the PLL modulation means comprising:
a first voltage-controlled oscillation means for performing outputting according to a reference signal caused by the oscillation of a resonator;
a phase comparison means for converting into a voltage the phase difference between the signal output from the first voltage-controlled oscillation means and a phase comparison signal input from a fractional-N type frequency divider and outputting the voltage as a phase difference signal;

a low-pass filtering means for removing a high-frequency component from the phase difference signal output from the phase comparison means;
a second voltage-controlled oscillation means for controlling an oscillation frequency according to the phase difference signal output from the low-pass filtering means as a control voltage; and
the fractional-N type frequency divider for frequency-dividing an branched output from the second voltage-controlled oscillation means,
wherein the PLL modulation means is configured as a digital PLL modulation means that can control the oscillation frequency according to the frequency divider setting signal,
wherein a loop is composed so that a part of a signal output by the second voltage-controlled oscillation means following the phase comparison means and the low-pass filtering means sequentially is divided by the fractional-N type frequency divider and then the part of the signal is input to the phase comparison means,
wherein the first voltage-controlled oscillation means is disposed outside of the loop and outputs an FM-modulated signal by analog FM-modulating the oscillation frequency of the reference signal with a modulating signal in accordance with the audio signal, and
wherein the first voltage-controlled oscillation means performs analog FM-modulation by controlling the oscillation frequency of the reference signal by causing the capacity of a varicap diode to vary according to the modulating signal in accordance with the audio signal as a control voltage.

* * * * *